United States Patent
Morishima

(10) Patent No.: US 7,161,868 B2
(45) Date of Patent: Jan. 9, 2007

(54) MULTIPORT SEMICONDUCTOR MEMORY DEVICE CAPABLE OF SUFFICIENTLY STEADILY HOLDING DATA AND PROVIDING A SUFFICIENT WRITE MARGIN

(75) Inventor: Chikayoshi Morishima, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 147 days.

(21) Appl. No.: 10/880,530

(22) Filed: Jul. 1, 2004

(65) Prior Publication Data

US 2005/0002215 A1 Jan. 6, 2005

(30) Foreign Application Priority Data

Jul. 2, 2003 (JP) .............................. 2003-190204

(51) Int. Cl.
*G11C 8/00* (2006.01)
(52) U.S. Cl. .................................. 365/230.05; 365/72
(58) Field of Classification Search ........... 365/230.05, 365/72
See application file for complete search history.

(56) References Cited

U.S. PATENT DOCUMENTS 6,201,758 B1 3/2001 Morishima et al.

6,731,566 B1 * 5/2004 Sywyk et al. .......... 365/230.05

FOREIGN PATENT DOCUMENTS

JP 1-251384 10/1989
JP 2001-143473 A 5/2001

* cited by examiner

*Primary Examiner*—Amir Zarabian
*Assistant Examiner*—Kretelia Graham
(74) *Attorney, Agent, or Firm*—McDermott, Will & Emery LLP

(57) ABSTRACT

A 2-port SRAM includes a memory cell having: a latch circuit holding potential at storage nodes complementarily; access transistors arranged between the storage nodes and bit lines, respectively, and turned on in response to word lines being activated; a write access transistor and a storage level drive transistor arranged between the storage nodes, respectively, and a ground potential and turned on in response to a first one of the word lines being activated and a sub bit line, respectively, and a write access transistor turned on in response to a second one of the word line being activated and a storage level drive transistor turned on in accordance with a sub bit line.

9 Claims, 9 Drawing Sheets

MULTIPORT SEMICONDUCTOR MEMORY DEVICE CAPABLE OF SUFFICIENTLY STEADILY HOLDING DATA AND PROVIDING A SUFFICIENT WRITE MARGIN

BACKGROUND OF THE INVENTION

1. Field of the Invention

The present invention relates to semiconductor memory devices and particularly to configurations of multiport static random access memories (hereinafter referred to as multiport SRAMs).

2. Description of the Background Art

FIG. 14 is a circuit diagram of a configuration in a first example of a memory cell used for a conventional 2-port static random access memory (SRAM), as described for example in Japanese Patent Laying-Open No. 1-251384. This memory cell will hereinafter be referred to as a 2-port SRAM memory cell.

As shown in FIG. 14, a 2-port SRAM memory cell M100 includes a latch circuit having p and n MOS transistors P100 and N100 connected in series between a power supply potential Vcc and a ground potential GND, and p and n MOS transistors P101 and N101 connected in series between power supply potential Vcc and ground potential GND.

MOS transistors P100, N100 have their respective gates both connected to a node S101 connecting MOS transistors P101 and N101. (Hereinafter this node will also be referred to as storage node S101.) MOS transistors P101, N101 have their respective gates both connected to a node connecting MOS transistors P100 and N100. (Hereinafter this node will also be referred to as a storage node S100.) In other words, p MOS transistors P100, P101 operate as load transistors and n MOS transistors N100, N101 operate as drive transistors.

2-port SRAM memory cell M100 further includes n MOS transistors N102, N103 connected between complementary write bit lines WB and /WB and storage nodes S100, S101, respectively. MOS transistors N102, N103 have their respective gates both connected to a common word line WWL. As such, MOS transistors N102, N103 have their respective gate potentials controlled via write word line WWL.

2-port SRAM memory cell M100 further includes n MOS transistors N104, N105 connected between complementary read bit lines RB and /RB and storage nodes S100, S101, respectively. MOS transistors N104, N105 have their respective gates both connected to a common read word line RWL. As such, MOS transistors N104, N105 have their respective gate potentials controlled via read word line RWL.

Thus p MOS transistors P100, P101 serve as load transistors and n MOS transistors N100, N101 serve as drive transistors, and n MOS transistors N102–N105 serve as access transistors to implement a so-called "CMOS" 2-port SRAM memory cell.

More specifically in the FIG. 14 2-port SRAM memory cell M100 while write word line WWL is active (or has the high level (or a power supply potential level)) data is written to storage nodes S100 and S101 via complementary write bit lines WB, /WB, respectively. While write word line WWL is inactive (or has the low level (or a ground potential level)) the data once written to storage nodes S100 and S101 is held steadily by a latch circuit formed of MOS transistors P100, P101, N100, N101.

While read word line RWL is active, data is read from storage nodes S100, S101 via complementary bit lines RB, /RB.

It is not necessary to periodically turn on word line WWL to effect refresh operation and data can be held in standby state in a memory cell. Hereinafter p MOS transistors P100, P101 will also be referred to as load transistors P100, P101, and n MOS transistors N100, N101 as drive transistors N100, N101, and n MOS transistors N102–N105 as access transistors N102–N105.

For the CMOS, 2-port SRAM memory cell, there have also be proposed other than the above first example of configuration a large number of examples in configuration that allow for rapid-reading and reduction in voltage, as disclosed for example in U.S. Pat. No. 6,201,758 and Japanese Patent Laying-Open No. 2001-143473.

The 2-port SRAM memory cell having a second exemplary configuration (not shown) has, as well as FIG. 14, series-connected p and n MOS transistors forming pair of inverters cross coupled to form a latch circuit to provide a CMOS configuration, and between a first read bit line and a first storage node a first n MOS transistor is arranged and between a second read bit line complementary to the first read bit line and a second storage node a second n MOS transistor is connected. The first and second n MOS transistors have their respective gate potentials both controlled via a read word line.

Between the first storage node and a ground potential, series connected, third and fourth n MOS transistors are connected. Between the second storage node and a ground potential, series-connected, fifth and sixth n MOS transistors are connected. The third and fifth n MOS transistors have their respective gate potentials controlled via a write word line. The fourth and sixth n MOS transistors have their respective gates connected to complementary first and second write bit lines, respectively.

Generally in an SRAM memory cell if a ratio in current driving force between an access transistor and a drive transistor that stores data is reduced then when a bit line is connected a storage node having the low level tends to readily increase in potential and static noise margin is reduced and accordingly data is held less steadily. In other words, the data held in the memory cell is destroyed and as a result an erroneous operation is caused. This ratio is generally referred to as β ratio and typically to ensure static noise margin the ratio is set to approximately three to four. In other words, a drive transistor is required to have a current driving force set to be higher than an access transistor.

The FIG. 14 conventional, 2-port SRAM memory cell M100 current driving force ratio (β ratio) will now be studied. Note that hereinafter drive transistor N100 will have a current driving force represented as DN100, access transistors N102, N104 will have those represented as DN102, DN104. Furthermore, current driving forces DN102, DN104 are set equivalently for the sake of illustration.

In 2-port SRAM memory cell M100 if data are written and read to and from memory cells of a single row, as differently timed, then, in response to write word line WWL and read word line RWL being activated, access transistors N102, N103 and access transistors N104, N105 are turned on as differently timed. As such, the β ratio is equal to that for a single-port SRAM, provided by DN100/DN102.

By contrast, if data are written and read to and from memory cells of a single row, as identically timed, access transistors. N102, N103 and access transistors N104, N105 are turned on as identically timed. The β ratio will be DN100/DN102×2, which is half that for a single-port SRAM and data would be held less steadily.

Thus in 2-port SRAM memory cell M100 two types of β ratio depending on patterns of the number of access transistors turned on are introduced and to ensure that data is held steadily the β ratios are both required to hold the level of the β ratio for single-port SRAM. In particular, multiport SRAMs have further increased patterns in number of access transistors turned on, and β ratio must be considered for each pattern.

Accordingly to ensure that a multiport SRAM holds data steadily a drive transistor's current driving force may advisably be set high. If the current driving force is set to high, however, the latch circuit enters an excessively stable state, which can render it difficult to write data.

Furthermore in recent years semiconductor integrated circuits are required to operate on reduced power supply voltages. This results in an SRAM memory cell holding data less steadily. Thus for multiport SRAMs it is increasingly difficult to ensure that data is held steadily and also ensure sufficient write margin.

Furthermore the above described, conventional multiport SRAM memory cell, in any configuration, has each port corresponding to only one of reading and writing data and does not allow a single port to accommodate both reading and writing data. This is an obstacle to freely designing a circuit.

SUMMARY OF THE INVENTION

The present invention contemplates a multiport semiconductor memory device capable of holding data sufficiently steadily and providing a sufficient write margin.

The present invention also contemplates a semiconductor memory device allowing each port to be used to read and write data.

The present invention in one aspect provides a semiconductor memory device having n ports each capable of accommodating reading and writing, n representing a natural number, including: a memory cell array having a plurality of memory cells arranged in a row and a column; n word lines associated with each row of the memory cells and selectively activated in accordance with a result of selection of a row in an operation performed to read and write through each of the n ports; a plurality of first bit lines having n thereof associated with each column of the memory cells, and each having a corresponding column's memory cells connected thereto; and a plurality of second bit lines having n thereof associated with each column of the memory cells, and each forming a bit line pair together with one of the plurality of first bit lines. Each memory cells includes: a latch circuit having first and second storage nodes to hold first and second potentials complementarily; i first access transistors arranged between the first storage node and i of the first bit lines and turned on responsively when a corresponding one of the i first ones of the word lines is activated, i being a natural number smaller than n; (n–i) second access transistors arranged between the second storage node and (n–i) of the first bit lines and turned on responsively when a corresponding one of (n–i) second ones of the word lines; (n–i) second write access transistors and (n–i) second storage level drive transistors arranged between the first storage node and the first potential in series and turned on in response to a corresponding one of the second word lines being activated and a potential of a corresponding one of the second bit lines, respectively; and i first write access transistors and i first storage level drive transistors arranged between the second storage node and the first potential in series, and turned on in response to a corresponding one of the first word lines being activated and a potential of a corresponding one of the second bit lines, respectively.

Thus the present multiport SRAM can prevent reduced current driving force ratios attributed to increased numbers of ports. The present multiport SRAM can hold data significantly steadily and provide a sufficient write margin.

Furthermore, each port can be used to read and write data, which can help to design.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
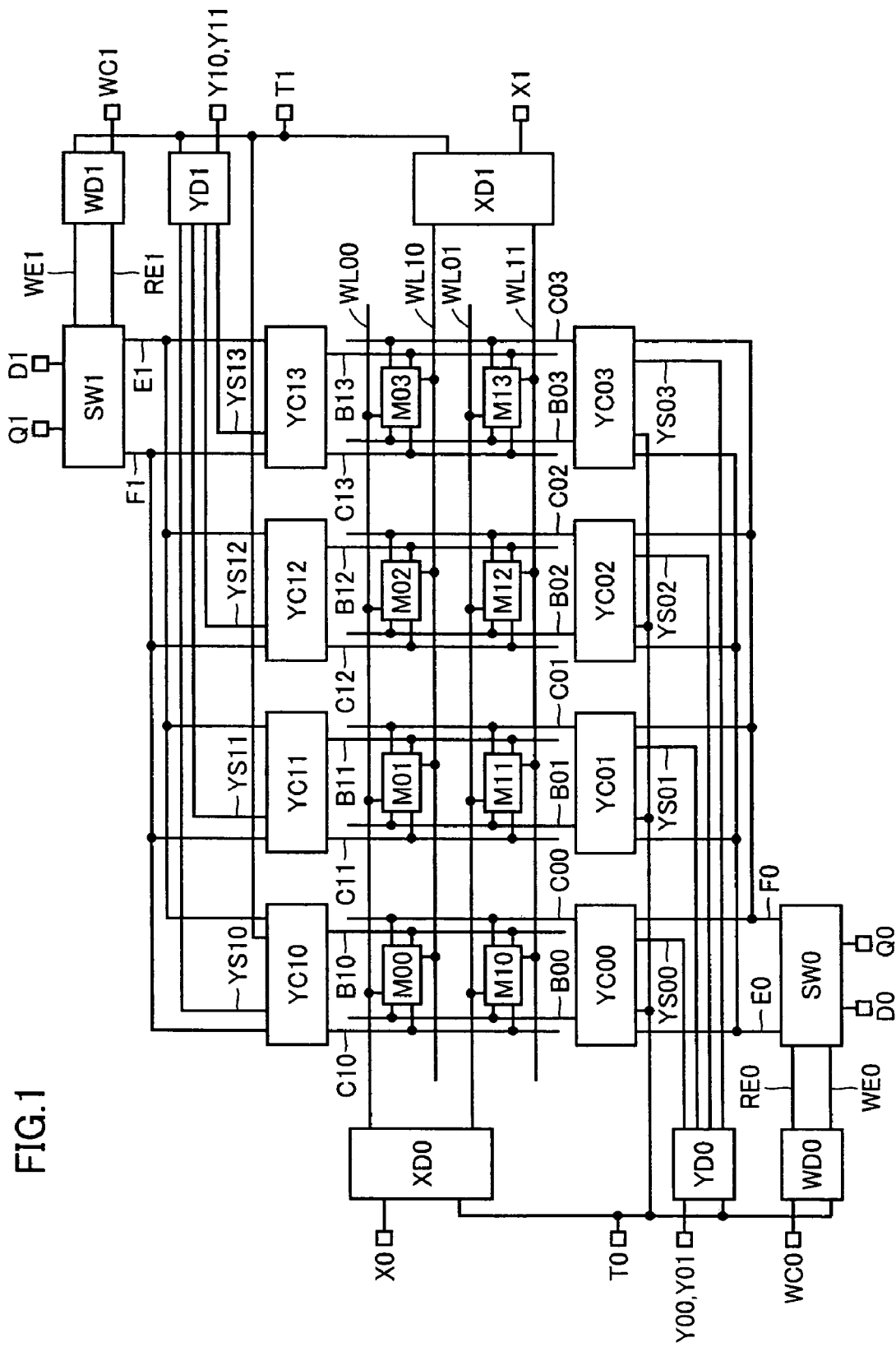
FIG. 1 is a schematic block diagram showing a configuration of a 2-port SRAM in accordance with the present invention in a first embodiment.

The present invention in embodiments will now be described more specifically with reference to the drawings. In the figures, like components are denoted by like reference characters and will not be described repeatedly.

First Embodiment

FIG. 1 is a schematic block diagram showing a configuration of a 2-port static semiconductor memory device of the present invention in a first embodiment.

While FIG. 1 shows a configuration of a 2-port SRAM having memory cells arranged in a matrix of two rows and four columns to simplify the description, the present invention is not limited to this configuration and is applicable to any multiport SRAMs having memory cells arranged in a matrix of more rows and columns.

With reference to FIG. 1, the 2-port SRAM includes: a memory array having memory cells M00–M03, M10–M13 arranged in two rows and four columns; word lines WL00, WL10 associated with the row of memory cells M00–M03;

word lines WL01, WL11 associated with the row of memory cells M10–M13; bit lines B00, B10 and sub bit lines C00, C10 shared by memory cells M00, M10; bit lines B01, B11 and sub bit lines C01, C11 shared by memory cells M01, M11; bit lines B02, B12 and sub bit lines C02, C12 shared by memory cells M02, M12; and bit lines B03, B13 and sub bit lines C03, C13 shared by memory cells M03, M13. Note that hereinafter if memory cells M00–M03, M10–M13 are collectively represented, they will be denoted by a character M. Furthermore, if bit lines B00–B03 and B10–B13 are collectively represented, they will be denoted by reference characters B0 and B1, respectively, and if sub bit lines C00–C03 and C10–C13 are collectively represented, they will be denoted by reference characters C0 and C1, respectively.

The 2-port SRAM has two ports, hereinafter referred to as ports 0 and 1, each allowing data to be read and written therethrough, and to do so, further includes row decode circuits XD0, XD1, column decode circuits YD0, YD1, control circuits WD0, WD1, read and write circuits SW0, SW1, and column circuits YC00–YC03, YC10–YC13.

Row decode circuit XD0 is associated with port 0 and receives an X address signal X0 and a clock signal T0 to selectively activate word line WL00 or WL01. Row decode circuit XD1 is associated with port 1 and receives an X address signal X1 and a clock signal T1 to selectively activate word line WL10 or WL11.

Column decode circuit YD0 is associated with port 0 and receives Y address signals Y00, Y01 and clock signal T0 to output column select signals YS00-YS03 to select a bit line. Column decode circuit YD1 is associated with port 1 and receives Y address signals Y10, Y11 and clock signal T1 to output column select signals YS10–YS13 to select a bit line.

When column circuits YC00–YC03 receive column select signals YS00–YS03, respectively, and clock signal T0, they synchronize with clock signal T0 to electrically couple their corresponding bit lines B0 and a data line E0 together and their corresponding sub bit lines C0 and a sub data line F0 together.

When column circuits YC10–YC13 receive column select signals YS10–YS13, respectively, and clock signal T1, they synchronize with clock signal T1 to electrically couple their corresponding bit lines B1 and a data line E1 together, and their corresponding sub bit lines C1 and a sub data line F1 together.

Control circuit WD0 receives a write signal WC0 applied to set an operation performed to read and write data through port 0 and clock signal T0 to output a write control signal WE0 and a read control signal RE0.

Control circuit WD1 receives a write signal WC1 applied to set an operation performed to read and write data through port 1 and clock signal T1 to output a write control signal WE1 and a read control signal RE1.

Read and write circuit SW0 operates in response to write control signal WE0 to write data signal D0, received at port 0, via data line E0 to a predetermined memory cell M designated by X address signal X0 and Y address signals Y00, Y0, when input data signal D0 drives via sub data line F0 the potential of sub bit line C0 connected to the predetermined memory cell M.

Read and write circuit SW0 also operates in response to read control signal RE0 to read data stored in a predetermined memory cell M designated by X address signal X0 and Y address signals Y00, Y01 and output the data as a data signal Q0 through port 0.

Read and write circuit SW1 operates in response to write and read control signals WE1 and RE1 to write a data signal D1, received at port 1, via data line E1 to a predetermined memory cell M selected by X address signal X1 and Y address signals Y10, Y11, and also read the data stored in the predetermined memory cell M and output the data as a data signal Q1 through port 1. Note that in a write, input data signal D1 drives via sub data line F1 the potential of sub bit line C1 connected to the predetermined memory cell M.

Of the circuits described above, row and column decode circuits XD0 and YD0, control circuit WD0, and read and write circuit SW0 are associated with an operation performed to read and write data through port 0. Note that hereinafter, clock signal T0, X address signal X0, Y address signals Y00, Y01, write signal WC0 and input and output data signals D0 and Q0 input to an output from each circuit for port 0 will also generally be referred to as a "signal associated with port 0."

By contrast, row and column decode circuits XD1 and YD1, control circuit WD1 and read and write circuit SW1 are associated with an operation performed to read and write data through port 1. Note that hereinafter, clock signal T1, X address signal X1, Y address signals Y10, Y11, write signal WC1, and input and output data signals D1 and Q1 input to an output from each circuit associated with port 1 will also generally be referred to as a "signal associated with port 1."

Figure 2:
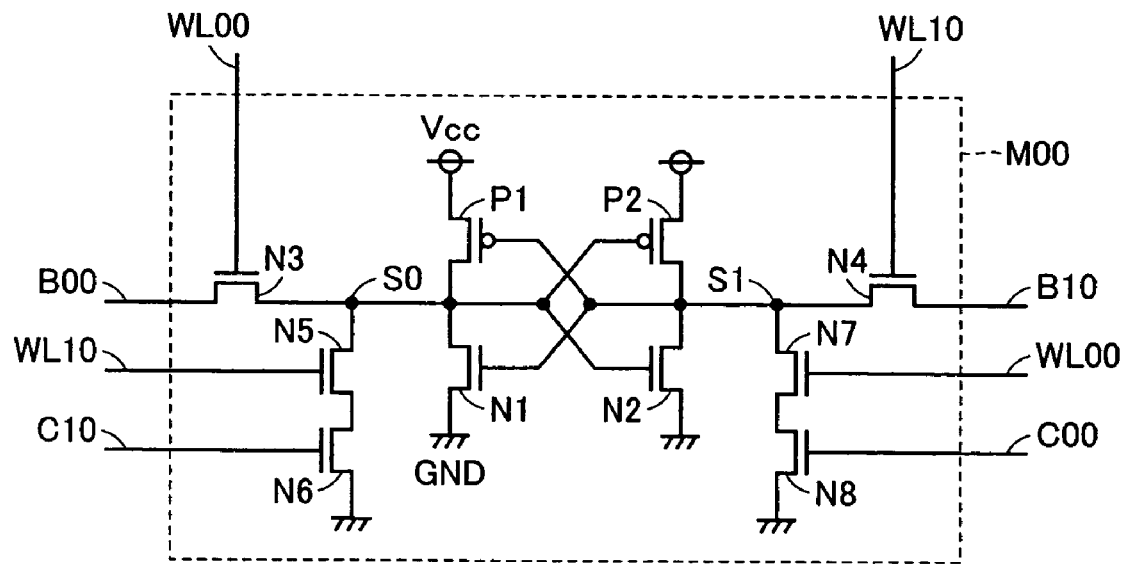
FIG. 2 shows a configuration of a memory cell M00 shown in FIG. 1.

FIG. 2 shows a configuration of memory cell M00 shown in FIG. 1. The other memory cells M01-M03, M10-M13 are also basically similar in configuration to memory cell M00 except that they have different word and bit lines connected thereto.

As shown in FIG. 2, memory cell M00 includes a latch circuit having p and n MOS transistors P1 and N1 connected in series between a power supply potential Vcc and a ground potential GND, and p and n MOS transistors P2 and N2 connected in series between power supply potential Vcc and ground potential GND.

MOS transistors P1, N1 have their respective gates both connected to a node S1 connecting MOS transistors P2 and N2. (Hereinafter this node will also be referred to as storage node S1.) MOS transistors P2, N2 have their respective gates both connected to a node S0 connecting MOS transistors P1 and N1. (Hereinafter this node will also be referred to as a storage node S0.)

Between bit line B00 and storage node S0 an n MOS transistor N3 is connected, and between bit line B10 and storage node S1 an n MOS transistor N4 is connected. MOS transistor N3 has a gate potential controlled via word line WL00. MOS transistor N4 has a gate potential controlled via word line WL10.

Thus p MOS transistors P1, P2 serve as load transistors and n MOS transistors N1, N2 serve as drive transistors, and n MOS transistors N3, N4 serve as access transistors to implement a CMOS, SRAM memory cell. Hereinafter p MOS transistors P1, P2 will also be referred to as load transistors P1, P2, and n MOS transistors N1, N2 as drive transistors N1, N2, and n MOS transistors N3, N4 as access transistors N3, N4.

Furthermore between storage node S0 and ground potential GND n MOS transistors N5, N6 are connected in series, and between storage node S1 and ground potential GND n MOS transistors N7, N8 are connected in series. N MOS transistor N5 has its gate controlled in potential via word line WL10. N MOS transistor N7 has its gate controlled in potential via word line WL00. N MOS transistor N6 has its gate connected to sub bit line C10 and n MOS transistor N8 has its gate connected to sub bit line C00. Note that n MOS transistors N6 and N8 function as storage level drive transistors, since they operate in write operation to drive to a storage node corresponding thereto a potential complementary to input data. Furthermore, n MOS transistors N5, N7 function in write operation as write access transistors for coupling together a storage node corresponding thereto and storage level drive transistors N6, N8.

Figure 3:
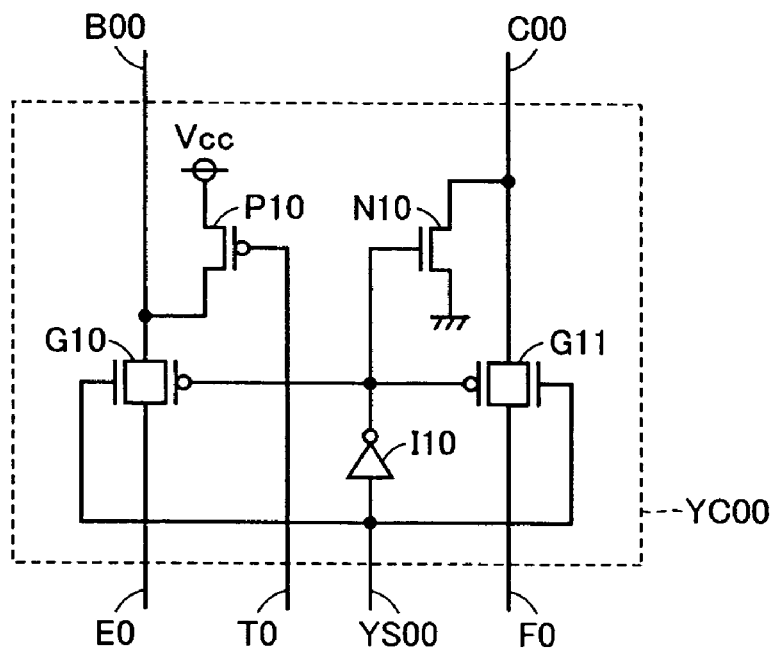
FIG. 3 is a circuit diagram showing a configuration of a column circuit YC00 shown in FIG. 1.

FIG. 3 is a circuit diagram showing a configuration of column circuit YC00 shown in FIG. 1. The other column circuits YC01–YC03, YC10–YC13 are also basically similar in configuration to column circuit YC00 except that they have different bit and sub bit lines connected thereto.

With reference to FIG. 3, column circuit YC00 includes a transfer gate G10 arranged between bit line B00 and data line E0, a transfer gate G11 arranged between sub bit line C00 and sub data line F0, a p MOS transistor P10 connected between bit line B00 and power supply potential Vcc, an n MOS transistor N10 connected between sub bit line C00 and ground potential GND, and an inverter I10.

When transfer gate G10 receives at its gate column select signal YS00 and column select signal YS00 inverted by inverter Icy, the gate operate in accordance with their logic levels to electrically couple/decouple bit line B00 and data line E0.

When transfer gate G10 receives at its gate column select signal YS00 and column select signal YS00 inverted by inverter Icy, the gate operate in accordance with their logic levels to electrically couple/decouple sub bit line C00 and sub data line F0.

When p MOS transistor P10 receives at its gate clock signal T0, the transistor operates in accordance with the signal's logic level to electrically couple/decouple power supply potential Vcc and bit line B00. More specifically, in response to clock signal T0 attaining the low level, or in standby state, p MOS transistor P10 is turned on to supply bit line B00 with power supply potential Vcc. By contrast, in response to clock signal T0 attaining the high level, or in active state, p MOS transistor P10 is turned off to decouple bit line B00 and power supply potential Vcc to stop precharging bit line B00.

When n MOS transistor N10 receives at its gate column select signal YS00 inverted by inverter I10, the transistor operates in accordance with the signal's logic level to electrically couple/decouple ground potential GND and sub bit line C00. More specifically, in response to column select signal YS00 attaining the low level, or in non-selected state, n MOS transistor N10 is turned on to couple sub bit line C00 and ground potential GND. By contrast, in response to column select signal YS00 attaining the high level, or in selected state, n MOS transistor N10 is turned off to decouple sub bit line C00 and ground potential GND.

In the above configuration when column select signal YS00 activated in synchronization with clock signal T0 is input, transfer gates G10, G11 are both turned on to electrically couple bit line B00 and data line E0, and sub bit line C00 and sub data line F0, respectively. Thus data are communicated between data line E0 and sub bit line F0 and bit line B00 and sub bit line C00, respectively.

Figure 4:
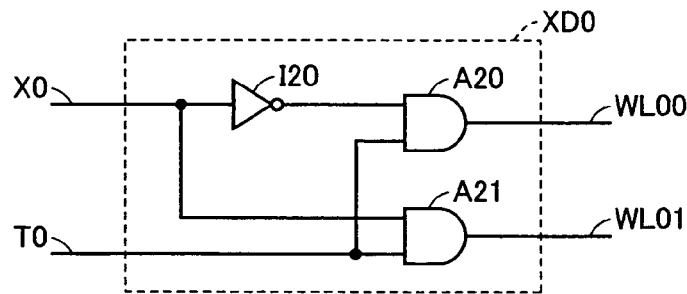
FIG. 4 is a circuit diagram showing a configuration of a row decode circuit XD0 shown in FIG. 1.

FIG. 4 is a circuit diagram showing a configuration of row decode circuit XD0 shown in FIG. 1. Row decode circuit XD1 is also basically similar in configuration to row decode circuit XD0 except that it receives a different X address signal and has a different word line connected thereto.

With reference to FIG. 4, row decode circuit XD0 includes an inverter I20 receiving and inverting X address signal X0, a 2-input AND circuit A20 receiving an output from inverter I20 and clock signal T0 to drive word line WL00 in potential, and a 2-input AND circuit A21 receiving X address signal X0 and clock signal T0 to drive word line WL01 in potential.

Row decode circuit XD0 operates in synchronization with clock signal T0 to select word line WL01 for X address signal X0 having the high level and word line WL00 for X address signal X0 having the low level.

Note that row decode circuit XD1 similarly operates in synchronization with clock signal T1 to select word line WL11 for X address signal X1 having the high level and word line WL10 for X address signal X1 having the low level.

Figure 5:
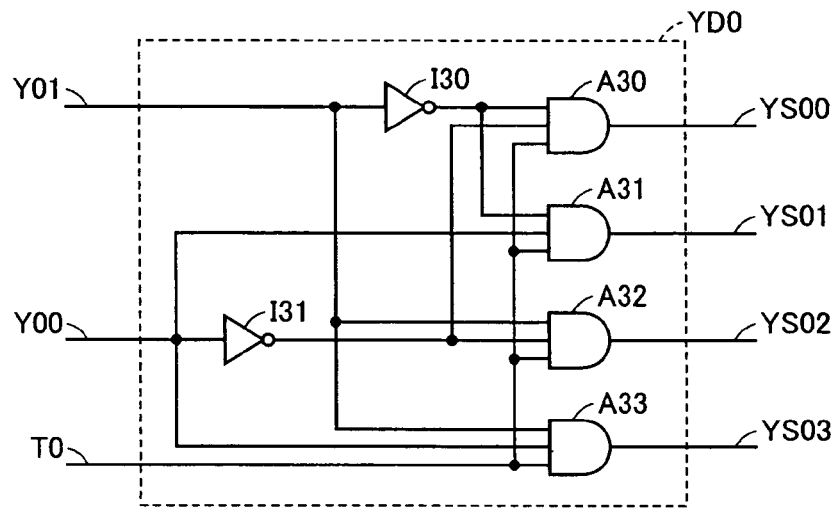
FIG. 5 is a circuit diagram showing a configuration of a column decode circuit YD0 shown in FIG. 1.

FIG. 5 is a circuit diagram showing a configuration of column decode circuit YD0 shown in FIG. 1. Column decode circuit YD1 is also basically similar in configuration to column decode circuit YD0 except that it receives a different Y address signal and a different clock signal.

With reference to FIG. 5, column decode circuit YD0 includes an inverter I30 receiving and inverting Y address signal Y01, an inverter I31 receiving and inverting Y address signal Y00, a 3-input AND circuit A30 receiving an output from inverter I30, an output from inverter I31 and clock signal T0 to output column select signal YS00, a 3-input AND circuit A31 receiving an output from inverter I30, Y address signal Y00 and clock signal T0 to output column select signal YS01, a 3-input AND circuit A32 receiving Y address signal Y01, an output from inverter I31 and clock signal T0 to output column select signal YS02, and a 3-input AND circuit A33 receiving Y address signals Y01, Y00 and clock signal T0 to output column select signal YS03.

In this configuration column decode circuit YD0 operates in synchronization with clock signal T0 to decode Y address signals Y00, Y01 and be driven by a result of the decoding to activate one of column select signals YS00–YS03, and one of column circuits YC00–YC03 that corresponds to the activated signal is driven to selected state.

Similarly column decode circuit YD1 closer to port 1 operates in synchronization with clock signal T1 to decode Y address signals Y10, Y11 and be driven by a result of the decoding to activate one of column select signals YS10–YS13, and one of column circuits YC10–YC13 that corresponds to the activated signal is driven to selected state.

Figure 6:
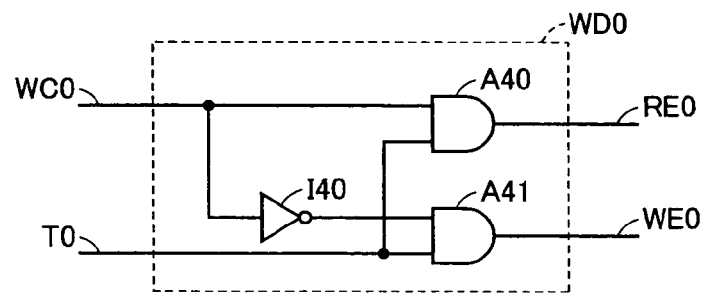
FIG. 6 is a circuit diagram showing a configuration of a control circuit WD0 shown in FIG. 1.

FIG. 6 is a circuit diagram showing a configuration of control circuit WD0 shown in FIG. 1. Control circuit WD1 is basically similar in configuration to control circuit WD0 except that it receives different write signal and clock signal.

With reference to FIG. 6, control circuit WD0 includes an inverter I40 receiving and inverting write signal WC0, a 2-input AND circuit A40 receiving write signal WC0 and clock signal T0 to output read control signal RE0, and a 2-input AND circuit A41 receiving an output from inverter I40 and clock signal T0 to output control signal WE0.

Control circuit WD0 is synchronized with clock signal T0 to set read control signal RE0 high for write signal WC0 having the high level and set control signal WE0 high for write signal WC0 having the low level.

Control circuit WD1 (not shown) is also synchronized with clock signal T1 to set read control signal RE1 high for write signal WC1 having the high level and set control signal WE1 high for write signal WC1 having the low level.

Figure 7:
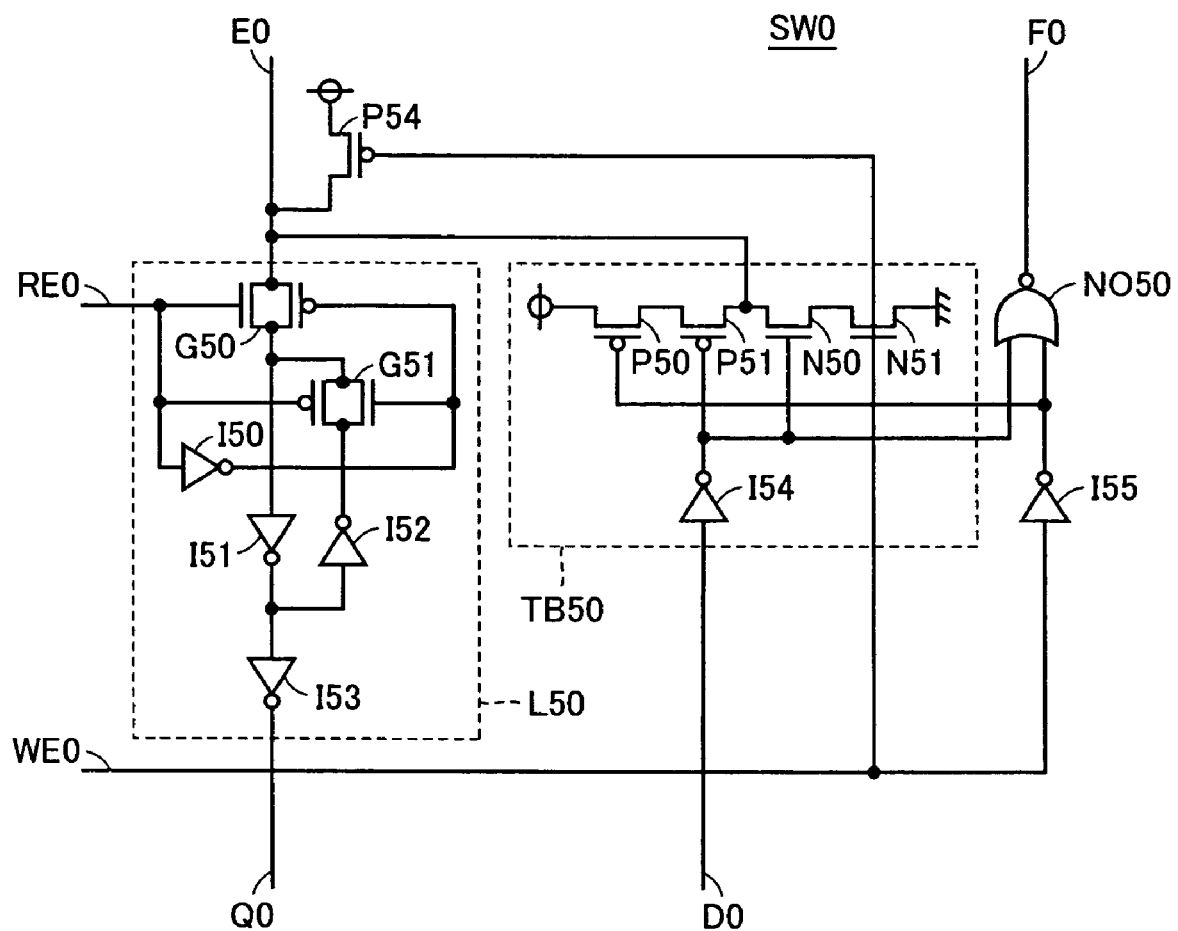
FIG. 7 is a circuit diagram showing a configuration of a read and write circuit SW0 shown in FIG. 1.

FIG. 7 is a circuit diagram showing a configuration of read and write circuit SW0 shown in FIG. 1.

With reference to the figure, read and write circuit SW0 includes a latch circuit L50 arranged between data line E0 and a terminal outputting data signal Q0 to operate in response to read control signal RE0 to output data on data line E0 as data signal Q0, and a tristate buffer circuit TB50 arranged between data line E0 and a terminal receiving data signal D0 to operate in response to control signal WE0 to output input data signal D0 on data line E0.

Latch circuit L50 includes transfer gates G50, G51 arranged between data line E0 and output data line Q0, and inverters I50–I53.

Transfer gate G50 has a gate receiving read control signal RE0 and read control signal RE0 inverted by inverter I50 and in response to a logic level thereof electrically couples/decouples data line E0 and an input node of inverter I51.

Inverters I51, I52 form a latching portion having an output node (an output node of inverter I51) coupled with an input node of inverter I53. Between the latching portion's input node and the inverter I52 output node, transfer gate G51 is arranged. Transfer gate G51 has a gate receiving read control signal RE0 and read control signal RE0 inverted by inverter I50 and in response to a logic level thereof the gate is turned on/off. When transfer gate G51 is turned on, inverters I51, I52 form the latching portion.

More specifically, when read control signal RE0 attains the high level transfer gate G50 is turned on to allow a data signal of data line E0 to be input to latch circuit L50. Subsequently when read control signal RE0 attains the low level transfer gate G51 is turned on to form a latching portion to hold the data signal. Furthermore the held data signal is output via inverter I53 as data signal Q0.

Tristate buffer circuit TB50 includes p MOS transistors P50, P51 and n MOS transistors N50, N51 connected between power supply potential Vcc and ground potential GND in series, and an inverter I54.

P MOS transistor P51 and n MOS transistor N50 have their respective gates receiving input data signal D0 inverted by inverter I54.

P MOS transistor P50 has a gate receiving control signal WE0 inverted by inverter I55 and n MOS transistor N51 has a gate receiving control signal WE0. MOS transistors P50, N51 turn on in response to control signal WE0 having the high level to electrically couple MOS transistors P51, N50 and power supply potential Vcc and ground potential GND, respectively. Thus between input data signal D0 and data line E0 MOS transistors P51 and N50 form a CMOS inverter, and input data signal D0 for control signal WE0 having the high level will be output via inverter I54 and the CMOS inverter to data line E0.

MOS transistors P50, N51 are turned off in response to control signal WE0 having the low level and MOS transistors P51, N50 are electrically decoupled. On data line E0, high impedance is output.

Read and write circuit SW0 further includes a p MOS transistor P54 coupled between power supply potential Vcc and data line E0 and turning off in response to write control signal WE0 having the high level to electrically decouple power supply potential Vcc and data line E0 and turning on in response to write control signal WE0 having the low level to electrically couple power supply potential Vcc and data line E0 to supply data line E0 with power supply potential Vcc.

P MOS transistor P54 serves to apply an appropriate voltage bias to a bit line to prevent reduced bit line potential and hereinafter will also be referred to as a bit line load transistor.

More specifically, the FIG. 2 2-port SRAM memory cell M00 has storage node S0 having data of the low level stored therein for the sake of illustration, and in a read if word line WL00 is not selected and access transistor N3 is turned off a current still flows from bit line B00 to storage node S0. This current further flows through drive transistor N1, turned on, into ground potential GND. The current is referred to as a "leak current" and increases as the number of memory cells coupled with bit line B00 is increased. As such, as the level of integration increases, the current disadvantageously acts to decrease bit line B00 in potential.

To address this, bit line load transistor P54 in a read with write control signal WE0 attaining the low level turns on to supply bit line B00 with potential.

The transistor is turned off in response to control signal WE0 having the high level so that in a write when the bit line is pulled down a storage node has as low a potential as possible (ultimately the ground potential level) to ensure a sufficient write margin.

Read and write circuit SW0 further includes a 2-input NOR circuit NO50 receiving input data signal D0 inverted by inverter I54 and write control signal WE0 inverted by inverter I55 to drive sub data line F0 in potential.

2-input NOR circuit NO50 operates in response to write control signal WE0 having the high level to invert the inverted version of input data signal D0 received from inverter I54 to output the further inverted signal on sub data line F0. In other words, input data signal D0 is output on sub data line F0.

For write control signal WE0 having the low level 2-input NOR circuit NO50 outputs on sub data line F0 a signal having the low level.

That is, when read control signal RE0 has the high level the data line E0 potential held by latch circuit L50 is output as output data signal Q0. As write control signal WE0 has the low level, bit line load transistor P54 is turned on to drive power supply potential Vcc on data line E0. Furthermore, 2-input NOR circuit NO50 outputs on sub data line F0 a signal having the low level.

For read control signal RE0 having the low level, the data line E0 data is held by latch circuit L50.

When write control signal WE0 has the high level, input data signal D0 is output on data line E0 via tristate buffer circuit TB50 and also on sub data line F0 via 2-input NOR circuit NO50.

For write control signal WE0 having the low level, data line E0 is supplied with power supply potential Vcc and sub data line F0 attains the low level.

Figure 8:
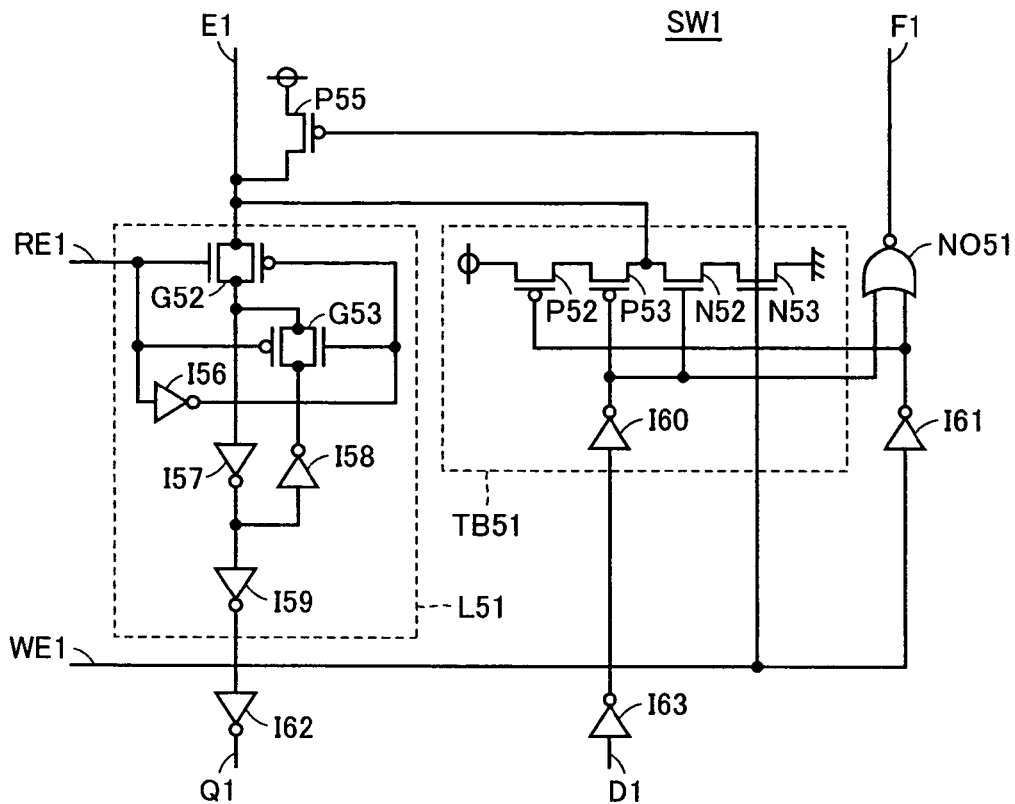
FIG. 8 is a circuit diagram showing a configuration of a read and write circuit SW1 shown in FIG. 1.

FIG. 8 is a circuit diagram showing a configuration of read and write circuit SW1 shown in FIG. 1.

With reference to the figure, read and write circuit SW1 includes a latch circuit L51 arranged between data line E1 and a terminal outputting data signal Q1 to operate in response to read control signal RE1 to output data on data line E1 as data signal Q1, and a tristate buffer circuit TB51 arranged between data line E1 and a terminal receiving data signal D1 to operate in response to write control signal WE1 to output input data signal D1 on data line E1.

Latch circuit L51 includes transfer gates G52, G53 arranged between data line E1 and output data line Q1, and inverters I56–I59.

Transfer gate G52 has a gate receiving read control signal RE1 and read control signal RE1 inverted by inverter I56 and in response to a logic level thereof electrically couples/decouples data line E1 and an input node of inverter I57.

Inverters I57, I58 form a latching portion having an output node (an output node of inverter I57) coupled with an input node of inverter I59.

Between the latching portion's input node and the inverter I58 output node, transfer gate G53 is arranged. Transfer gate G53 has a gate receiving read control signal RE1 and read control signal RE1 inverted by inverter I56 and in response to a logic level thereof the gate is turned on to form the latching portion.

More specifically, when read control signal RE1 attains the high level transfer gate G52 is turned on to allow a data signal of data line E1 to be input to latch circuit L51. Subsequently when read control signal RE1 attains the low level transfer gate G53 is turned on to form a latching portion to hold the data signal. Furthermore the held data signal is output via inverter I59.

Inverter I59 has an output node connected to an inverter I62 receiving a signal from inverter I59 to invert the signal to output it as output data signal Q1. Note that the FIG. 8 read and write circuit SW1 differs from the FIG. 7 read and write circuit SW0 in that latch circuit L51 has an output node provided with inverter I62.

Tristate buffer circuit TB51 includes p MOS transistors P52, P53 and n MOS transistors N52, N53 connected between power supply potential Vcc and ground potential GND in series, and an inverter I60.

Inverter I60 has an input node connected to an inverter I63 inverting input data signal D1 for output to inverter I60. Note that the FIG. 8 circuit differs from FIG. 7 circuit in that tristate buffer TB51 has an input node provided with inverter I63.

P MOS transistor P53 and n MOS transistor N52 have their respective gates receiving input data signal D1 via inverters I63, I60.

P MOS transistor P52 has a gate receiving write control signal WE1 inverted by inverter I61 and n MOS transistor N53 has a gate receiving write control signal WE1. MOS transistors P52, N53 turn on in response to write control signal WE1 having the high level to electrically couple MOS transistors P53, N52 and power supply potential Vcc and ground potential GND, respectively. Thus between input data signal D1 and data line E1 MOS transistors P53 and N52 form a CMOS inverter, and input data signal D1 for control signal WE1 having the high level will be output via inverters I63, I60 and the CMOS inverter to data line E1.

MOS transistors P52, N53 are turned off in response to write control signal WE1 having the low level and MOS transistors P53, N52 are electrically decoupled. On data line E1, high impedance is output.

Read and write circuit SW1 further includes a p MOS transistor P55 coupled between power supply potential Vcc and data line E1. P MOS transistor P55, as well as the FIG. 7 p MOS transistor P54, configures a bit line load transistor. More specifically in a write the transistor turns off in response to write control signal WE1 having the high level to electrically decouple power supply potential Vcc and data line E1 and in a read the transistor turns on in response to write control signal WE1 having the low level to electrically couple power supply potential Vcc and data line E1 to supply data line E1 with power supply potential Vcc.

Read and write circuit SW1 further includes a 2-input NOR circuit NO51 receiving input data signal D1 via inverters I63, I60 and an inverted version of write control signal WE1 from inverter I61 to drive sub data line F1 in potential.

2-input NOR circuit NO51 operates in response to write control signal WE1 having the high level to output an inverted version of input data signal D1 on sub data line F1. For write control signal WE1 having the low level, 2-input NOR circuit NO51 outputs on sub data line F1 a signal having the low level.

Read and write circuit SW1 described above is basically similar in configuration to the FIG. 7 read and write circuit SW0, except that, as has been described above, data signal Q1 is output through a node provided with inverter I62 and data signal Q1 is input through a node provided with inverter I63. This is done to address that in the FIG. 1 memory cell M00, storage node S0 associated with reading and writing through port 0 and storage node S1 associated with reading and writing through port 1 store complementary data.

The 2-port SRAM thus configured operates to read and write data, as described hereinafter.

Initially will be described an operation performed to write data of the low level to the FIG. 1 memory cell M00 through port 0.

Before it starts a write operation, the 2-port SRAM has standby state in response to clock signal T0 having the low level. In the standby state, all word lines WLs and sub bit line C shown in FIG. 1 are fixed low, while bit line B00 is fixed high, as shown in the FIG. 3 column circuit YC00, as p transistor P10 is turned on in response to clock signal T0 having the low level.

Subsequently, the 2-port SRAM enters active state and clock signal T0 rises to the high level. In response, bit line B00 is decoupled from power supply potential Vcc. In synchronization with clock signal T0 X address signal X0 and Y address signals Y00, Y01 are set low and word line WL00 and column select signal YS00 go high to drive memory cell M00 to selected state.

Furthermore in synchronization with clock signal T0 write signal WC0 having the low level is input to control circuit WD0 and write control signal WE0 having the high level is in response input to read and write circuit SW0. Read and write circuit SW0 simultaneously receives input data signal D0 having the low level.

Read and write circuit SW0 operates in response to control signal WE0 having the high level to allow input data signal D0 having the low level to be output through tristate buffer circuit TB50 to data line E0, and sub data line F0 also receives an input data signal having the low level.

The FIG. 3 column circuit YC00 receives data and sub data lines E0 and F0 having the low level from read and write circuit SW0, clock signal T0 having the high level, and column select signal YS00 having the high level. Transfer gates G10, G11 are turned on in response to the column select signal having the high level, and on bit and sub bit lines B00 and C00 data of data and sub data lines E0 and F0, respectively, having the low level are driven.

With reference to the FIG. 2 memory cell M00, when access transistor N3 is turned on in response to word line WL00 having the high level the bit line B00 potential having the low level is transmitted to storage node S0. Storage node S0 thus has the low level written thereto.

As sub bit line C00 has the low level, n MOS transistor N8 is turned off, and storage node S1 and ground potential GND are electrically decoupled. Furthermore, as storage node S0 has the low level, load transistor P2 is turned on, and storage node S1 is driven high in potential.

Subsequently will be described an operation performed to write data having the high level to the FIG. 1 memory cell M00 through port 0.

As has been described previously for writing data having the low level, active state is entered and clock signal T0 rises to the high level. In response, bit line B00 is decoupled from power supply potential Vcc in response to p MOS transistor P10 being turned off. In synchronization with clock signal T0 X address signal X0 and Y address signals Y00, Y01 are set low and word line WL00 and column select signal YS00 go high to drive memory cell M00 to selected state.

Furthermore in synchronization with clock signal T0 write signal WC0 having the low level is input to control circuit WD0 and write control signal WE0 having the high level is in response input to read and write circuit SW0. Read and write circuit SW0 simultaneously receives input data signal D0 having the high level.

Read and write circuit SW0 operates in response to control signal WE0 having the high level to allow input data signal D0 having the high level to be output through tristate buffer circuit TB50 to data line E0, and sub data line F0 also receives an input data signal having the high level.

The FIG. 3 column circuit YC00 receives data and sub data lines E0 and F0 having the high level from read and write control circuit SW0, clock signal T0 having the high level, and column select signal YS00 having the high level. Transfer gates G10, G11 are turned on in response to the column select signal having the high level, and on bit and sub bit lines B00 and C00 data of data and sub data lines E0 and F0, respectively, having the high level are driven.

Furthermore, with reference to the FIG. 2 memory cell M00, when access transistor N3 is turned on in response to word line WL00 having the high level the bit line B00 potential having the high level is transmitted to storage node S0. Storage node S0 thus has the high level written thereto.

Furthermore, as word line WL00 and sub bit line C00 has the high level, n MOS transistors N7, N8 are both turned on, and storage node S1 and ground potential GND are electrically coupled. Thus storage node S1 is driven low in potential.

Subsequently will be described an operation performed to read data having the low level from the FIG. 1 memory cell M00 at port 0.

Active state is entered and clock signal T0 rises to the high level. In response, bit line B00 is decoupled from power supply potential Vcc in response to p MOS transistor P10 being turned off. In synchronization with clock signal T0 X address signal X0 and Y address signals Y00, Y01 are set low and word line WL00 and column select signal YS00 go high to drive memory cell M00 to selected state.

In the FIG. 1 memory cell M00 when access transistor N3 is turned on in response to word line WL00 having the high level, bit line B00 has potential discharged for storage node S0 and thus pulled down from power supply potential Vcc.

In the FIG. 3 column circuit YC00 transfer gate G10 turns on in response to column select signal YS00 having the high level to electrically couple bit line B00 and data line E0.

Furthermore in synchronization with clock signal T0 write signal WC0 having the high level is input to control circuit WD0 and read control signal RE0 having the high level is in response output and input to read and write circuit SW0.

Read and write circuit SW0 responds to read control signal RE0 having the high level by turning on transfer gate G50 and turning off transfer gate G51 to couple data line E0 and a terminal outputting data signal Q0.

Furthermore control circuit WD0 outputs write control signal WE0 having the low level which turns on bit line load transistor P54 to electrically couple data line E0 and power supply potential Vcc.

Thus between power supply potential Vcc and ground potential GND there exist a portion equivalent to the read and write circuit SW0 bit line load transistor P54, the column circuit YC0 transfer gate G10 and the memory cell M00 drive and access transistors N1 and N3 having their respective on resistances connected in series. Data line E0 thus receives a potential of a node connecting bit line load transistor P54 and transfer gate G10 together that reflects a ratio of the on resistances.

Accordingly, the current driving force of bit line load transistor P54 is set to allow data line E0 to have potential smaller than a logic threshold value of inverter I51. This ensures that the data line E0 potential is identified as the low level and inverter I51 accordingly outputs a potential having the high level and data signal Q0 having the low level is output.

Sub bit line C00 in column circuit YC00 is coupled with sub data line F0 having the low level. It attains the low level, and memory cell M00 has n MOS transistor N8 turned off and storage node S1 does not vary in potential.

Furthermore, when clock signal T0 falls to the low level, control circuit WD0 also outputs read control signal RE0 falling to the low level. Thus read and write circuit SW0 has latching portion L50 with transfer gate G51 turned on to form a latch circuit to hold read data having the low level.

Finally will be described an operation performed to read data having the high level from the FIG. 1 memory cell M00 at port 0.

Active state is entered and clock signal T0 rises to the high level. In response, bit line B00 is decoupled from power supply potential Vcc in response to p MOS transistor P10 being turned off. In synchronization with clock signal T0 X address signal X0 and Y address signals Y00, Y01 are set low and word line WL00 and column select signal YS00 go high to drive memory cell M00 to selected state.

In the FIG. 1 memory cell M00 when access transistor N3 is turned on in response to word line WL00 having the high level, bit line B00 has a potential maintained at the high level as no charge is communicated with data of the high level of storage node S0.

In the FIG. 3 column circuit YC00 transfer gate G10 turns on in response to column select signal YS00 having the high level to electrically couple bit line B00 and data line E0.

Furthermore in synchronization with clock signal T0 write signal WC0 having the high level is input to control circuit WD0 and read control signal RE0 having the high level is in response output and input to read and write circuit SW0.

Read and write circuit SW0 responds to read control signal RE0 having the high level by turning on transfer gate G50 and turning off transfer gate G51 to couple data line E0 and a terminal outputting data signal Q0.

Furthermore control circuit WD0 outputs write control signal WE0 having the low level which turns on bit line load transistor P54 to electrically couple data line E0 and power supply potential Vcc.

Thus data having the high level driven to bit line B00 is output on data line E0 as data signal Q0.

In response to write control signal WE0 having the low level 2-input NOR circuit NO50 operates to allow a signal having the low level to be driven on sub data line F0. Sub bit line C00 in column circuit YC00 is coupled with sub data line F0 having the low level. It attains the low level, and memory cell M00 has n MOS transistor N8 turned off and storage node S1 does not vary in potential.

Furthermore, when clock signal T0 falls to the low level, control circuit WD0 also outputs read control signal RE0 falling to the low level. Thus read and write circuit SW0 has latching portion L50 with transfer gate G51 turned on to form a latch circuit to hold read data having the high level.

Figure 9:
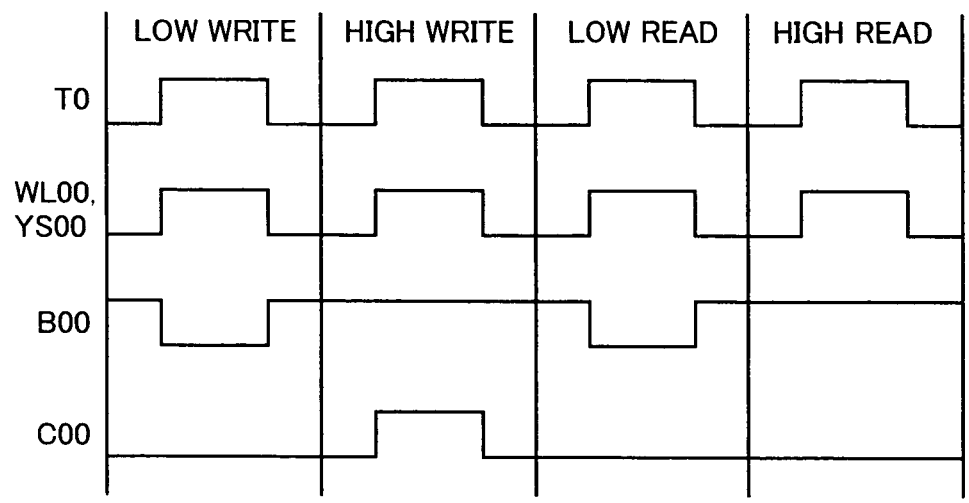
FIG. 9 is timing plots for illustrating an operation performed to read and write through a port 0 of the FIG. 1 2-port SRAM.

FIG. 9 is timing plots for illustrating an operation performed to write and read data to and from the FIG. 1 2-port SRAM at port 0 as described above.

With reference to the figure, to write data having the low and high levels through port 0 the potential of input data signal D0 is driven on bit line B00 and a potential equal to that of input data signal D0 is also driven on sub bit line C00. Furthermore, as selected word line WL00 is activated, memory cell M00 will have storage node S0 receiving the potential of bit line B00 and storage node S1 receiving a potential complementary to that of storage node S0. In other words, data is written via bit line B00 and sub bit line C00.

In contrast, to read data having the low and high levels through port 0, the potential of storage node S0 is driven on bit line B00, while sub bit line C00 holds the low level, and storage node S1 does not vary in potential.

While memory cell M00 has data read therefrom/written thereto through port 0, as described above, the memory cell similarly has data read therefrom/written thereto through port 1. It should be noted, however, that in memory cell M00, access at port 1 associated with reading and writing the storage node S1 potential and that at port 0 associated with reading and writing the storage node S0 potential as described above are complementary to each other, and reading/writing data through port 0 and doing so through port 1 are different only in that read and write circuit SW1 has inverters I62, I63 operated to invert output and input data signals Q1, D1, respectively.

Finally will be studied β ratio in 2-port SRAM memory cell M00 shown in FIG. 1. Note that hereinafter drive transistors N1, N2 have current driving forces represented by DN1, DN2, and access transistors N3, N4 have current driving forces represented by DN3, DN4. Furthermore to simplify the description symmetrical transistors have equal current driving forces, i.e., DN1=DN2 and DN3=DN4.

In 2-port SRAM memory cell M00 if data is read from/written to memory cells of the same row through ports 0 and 1, as differently timed, then when word lines WL00 and WL10 are activated, access transistors N3, N4 are responsively turned on as differently timed. Thus the β ratio is equal to that for a single port SRAM, given by DN1/DN3 (=DN2/DN4).

By contrast if data is read from/written to memory cells of the same row through ports 0 and 1, as identically timed, then access transistors N3, N4 are turned on as identically timed. As storage nodes S0, S1 each have a single access transistor connected thereto, the β ratio will be DN1/DN3 (=DN2/DN4), equivalent to that for a single port SRAM.

In other words, the present embodiment provides a 2-port SRAM having each storage node having connected thereto a number of access transistors that corresponds to half a total number of ports, i.e., one. Whatever pattern the number of access transistors turned on in memory cell may form, a β ratio of the same level as a single port SRAM can be maintained. Data can be held more steadily than it is in a conventional 2-port SRAM.

Furthermore this can eliminate the necessity of enhancing the drive transistor's current driving force to ensure that data is held steadily. A sufficient data write margin can thus be held.

Furthermore in a conventional multiport SRAM each port accommodates only one of reading and writing, whereas in the present embodiment each port can accommodate both reading and writing and thus facilitate design.

Second Embodiment

Figure 10:
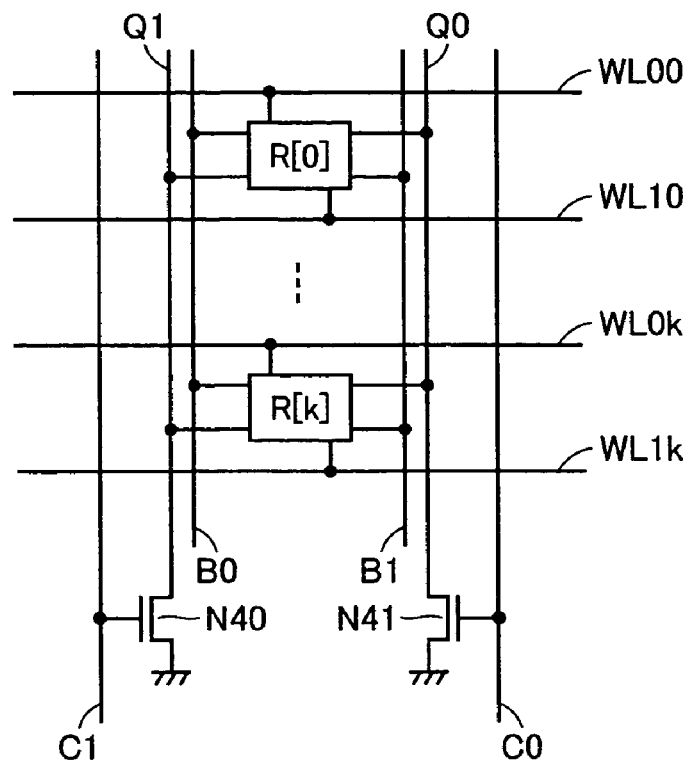
FIG. 10 is a schematic block diagram showing a configuration of the present 2-port SRAM in a second embodiment.

FIG. 10 is a schematic block diagram extracting and showing a configuration of a memory array of the present 2-port SRAM in a second embodiment.

With reference to the figure, the 2-port SRAM includes memory cells R[0]–R[k] arranged in k+1 rows and one column, word lines WL00, WL10 . . . WL0k, WL1k correspondingly associated with the rows of memory cells, bit lines B0 and B1 shared by memory cells R[0]–R[k], sub bit lines C0 and C1, and common signal lines Q0 and Q1 shared by memory cells R[0]–R[k], wherein k represents a natural number. Note that while in the present embodiment a single column of memory cells is used by way of example, a plurality of columns of memory cells may also be applicable.

Between common signal line Q0 and ground potential GND an n MOS transistor N41 is connected. Transistor N41 has a gate potential controlled via sub bit line C0.

Between common signal line Q1 and ground potential GND an n MOS transistor N40 is connected. Transistor N40 has a gate potential controlled via sub bit line C1.

Note that the 2-port SRAM of the present embodiment differs from that of the first embodiment shown in FIG. 1 only in memory cell configuration. Accordingly, the other circuits mounted on the 2-port SRAM will not specifically be described in configuration.

Figure 11:
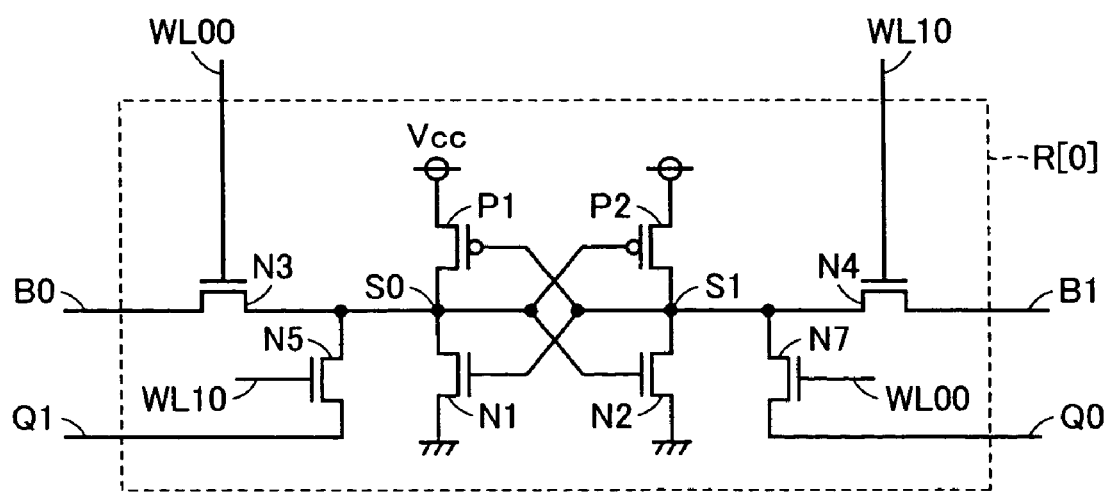
FIG. 11 shows a configuration of a memory cell R[0] shown in FIG. 10.

FIG. 11 shows a configuration of memory cell R[0] shown in FIG. 10. The other memory cells R[1]–R[k] are basically similar in configuration to memory cell R[0] except that they have different word and bit lines connected thereto.

With reference to FIG. 11, memory cell R[0] includes a latch circuit formed of p and n MOS transistors P1 and N1 connected between power supply potential Vcc and ground potential GND in series and p and n MOS transistors P2 and N2 connected between power supply potential Vcc and ground potential GND in series.

MOS transistors P1, N1 have their respective gates both connected to a node S1 connecting MOS transistors P2 and N2. (Hereinafter this node will also be referred to as storage node S1.) MOS transistors P2, N2 have their respective gates both connected to a node S0 connecting MOS transistors P1 and N1. (Hereinafter this node will also be referred to as a storage node S0.)

Between bit line B0 and storage node S0 an n MOS transistor N3 is connected, and between bit line B1 and storage node S1 an n MOS transistor N4 is connected. MOS transistor N3 has a gate potential controlled via word line WL00. MOS transistor N4 has a gate potential controlled via word line WL10.

Thus p MOS transistors P1, P2 serve as load transistors and n MOS transistors N1, N2 serve as drive transistors, and n MOS transistors N3, N4 serve as access transistors to implement a CMOS, SRAM memory cell.

Between storage node S0 and common signal line Q1 an n MOS transistor N5 is connected and between storage node S1 and common signal line Q0 an n MOS transistor N7 is connected. N MOS transistor N5 has a gate potential controlled via word line WL10. N MOS transistor N7 has a gate potential controlled via word line WL00.

Memory cell R[0] described above, as well as memory cell M00 of the first embodiment shown in FIG. 2, has a CMOS configuration, although the former differs from the latter in that between n MOS transistors N5, N7 and ground potential GND there do not exist n MOS transistors N6, N8, respectively. In the present embodiment these MOS transistors are replaced with a pair of n MOS transistors N40, N41 shared by k+1 memory cells R[0]–R[k].

In the present embodiment the 2-port SRAM performs a data read and write operation common to the first embodiment, although in a memory cell it operates differently. For example when data is to be written to memory cell R[0] through port 0 and n MOS transistor N41 is turned on/off in response to a potential driven by sub data line F0 (not shown) on sub bit line C0 a corresponding common signal line Q0 and ground potential GND are electrically coupled/decoupled.

Furthermore in response to word line WL00 having been activated a corresponding n MOS transistor N7 is turned on and the common signal line Q0 potential is driven to storage node S1.

Similarly, when data is to be written to memory cell R[0] through port 1 and n MOS transistor N40 is turned on/off in response to a potential driven by sub data line F1 (not shown) on sub bit line C1 a corresponding common signal line Q1 and ground potential GND are electrically coupled/decoupled.

Furthermore in response to word line WL10 having been activated a corresponding n MOS transistor N5 is turned on and the common signal line Q1 potential is driven to storage node S0.

Thus the 2-port SRAM of the present embodiment provides a current driving ability ratio (β ratio) similar to that of the first embodiment so that it can hold data as steadily as a single-port SRAM. Similarly, it can also provide a sufficient write margin.

Figure 12:
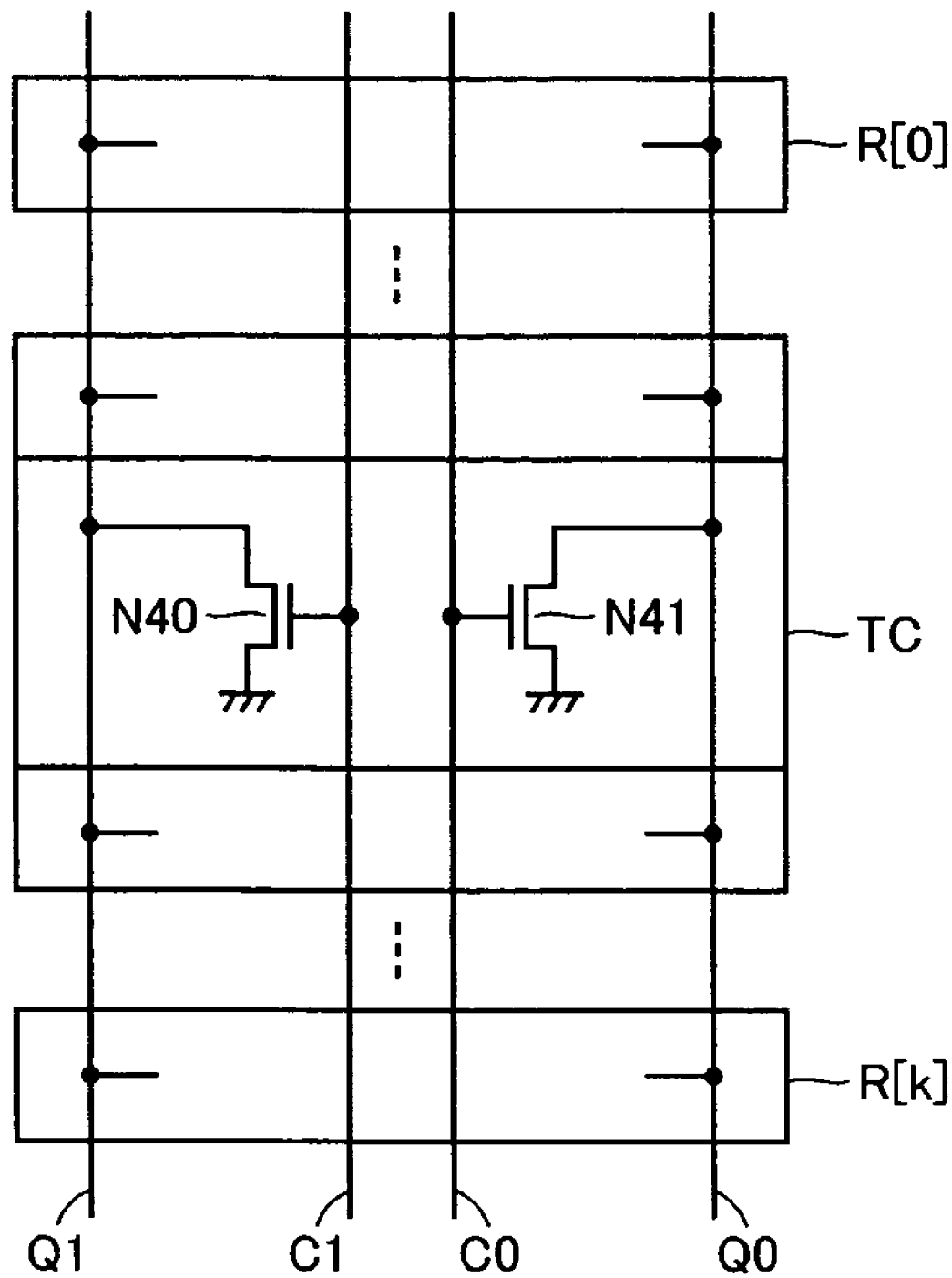
FIG. 12 schematically shows a layout of a configuration of the FIG. 10 2-port SRAM.

FIG. 12 schematically shows by way of example an arrangement of the memory array of the 2-port SRAM shown in FIG. 10.

With reference to the figure, the 2-port SRAM has the FIG. 10 memory cells R[0]–R[k] arranged along the column in alignment. Memory cells R[0]–R[k] share sub bit lines C0, C1 and common signal lines Q0, Q1 extending along the memory cells.

The 2-port SRAM includes a single well contact cell TC arranged along the column in alignment with memory cells R[0]–R[k]. Well contact cell TC is a region provided to couple each memory cell's well region and power supply potential Vcc or ground potential GND together and one cell thereof is provided for a plurality of memory cells, as shown in FIG. 12, to achieve reduced area.

Memory cells R[0]–R[k] share n MOS transistors N40, N41, which can be arranged in well contact cell TC to avoid an increased area otherwise resulting from the provision of n MOS transistors N40, N41.

Thus the present invention in the second embodiment provides a 2-port SRAM that can hold data at steadily as a single port SRAM or the like and provide a sufficient write margin, and thus facilitate design.

Furthermore a transistor used to write data can be shared by a plurality of memory cells. This can prevent an increased circuit scale otherwise introduced by arranging the transistor. Furthermore, arranging a transistor within a well contact cell shared by a plurality of memory cells can contribute to a further reduced area.

Third Embodiment

Figure 13:
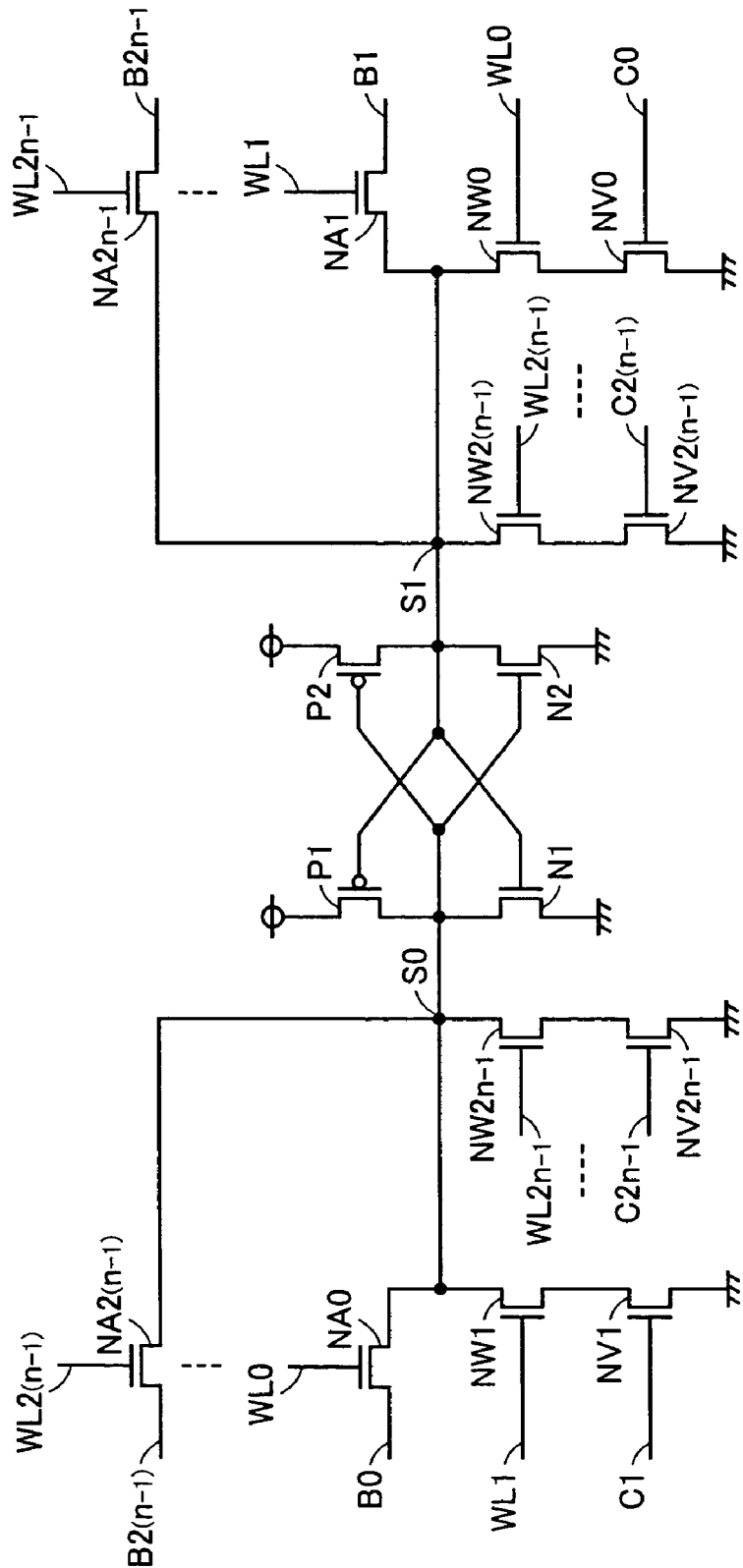
FIG. 13 is a circuit diagram showing a configuration of the present multiport SRAM memory cell in a third embodiment.
Figure 14:
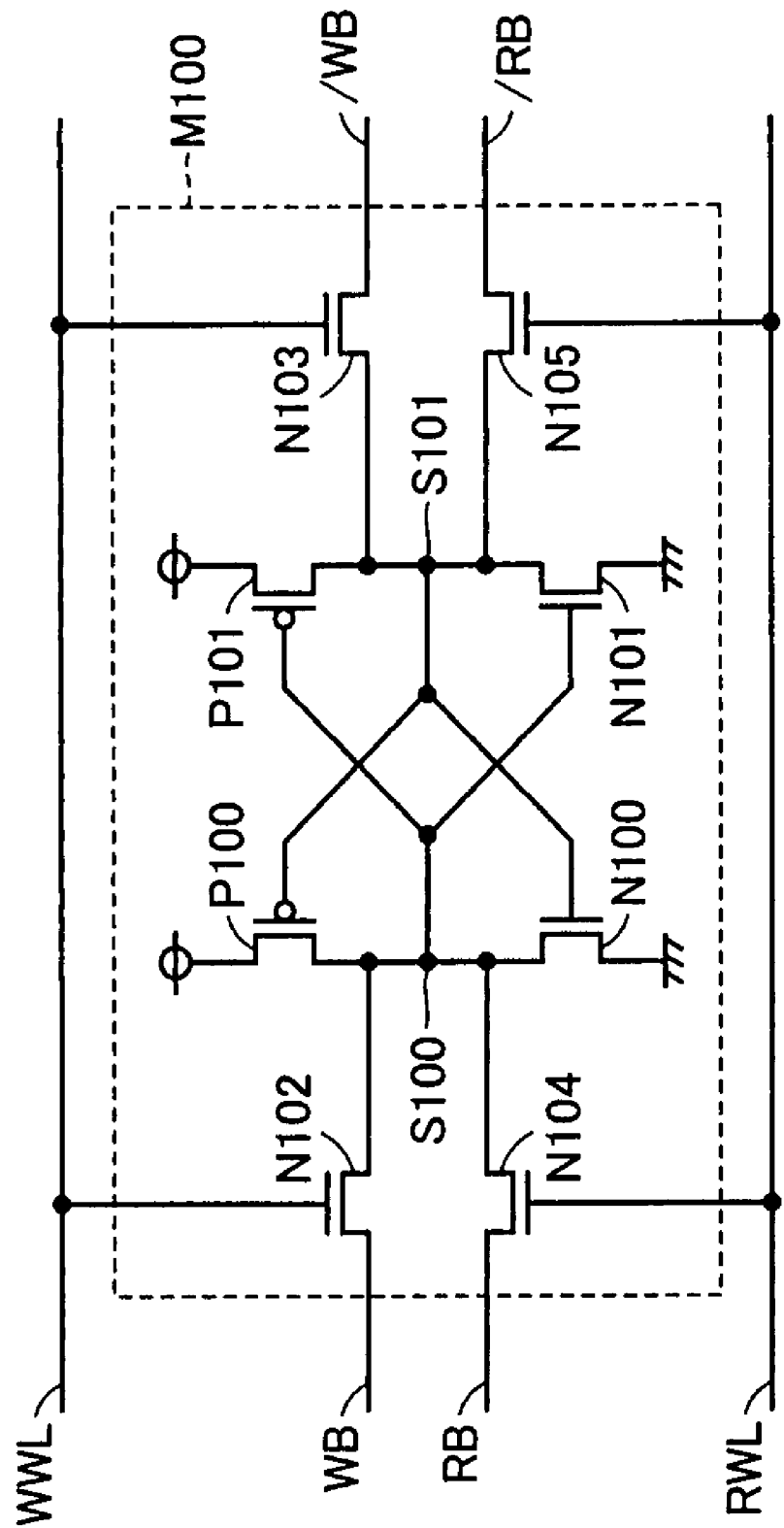
FIG. 14 is a circuit diagram showing a first exemplary configuration of a conventional 2-port SRAM memory cell.

FIG. 13 is a circuit diagram showing a configuration of the present multiport SRAM memory cell in a third embodiment.

With reference to the figure, the multiport SRAM memory cell, having 2n ports, wherein n is a natural number, includes a latch circuit formed of p and n MOS transistors P1 and N1 connected between power supply potential Vcc and ground potential GND in series and p and n MOS transistors P2 and N2 connected between power supply potential Vcc and ground potential GND in series.

MOS transistors P1, N1 have their respective gates both connected to a node S1 connecting MOS transistors P2 and N2. (Hereinafter this node will also be referred to as storage node S1.) MOS transistors P2, N2 have their respective gates both connected to a node connecting MOS transistors P1 and N1. (Hereinafter this node will also be referred to as a storage node S0.) In other words, p MOS transistors P1, P2 serve as load transistors and n MOS transistors N1, N2 serve as drive transistors.

The multiport SRAM memory cell further includes n n MOS transistors NA0 to NA2(n–1) connected between storage node S0 and bit lines B0 to B2(n–1), respectively, and n n MOS transistors NA1 to NA2n–1 connected between storage node S1 and bit lines B1 to B2n–1, respectively.

MOS transistors NA0 to NA2(n–1) have their respective gates connected to word lines WL0 to WL2(n–1), respectively. As such, MOS transistors NA0 to NA2(n–1) are each controlled via their respectively corresponding word lines WL0 to WL2(n–1).

MOS transistors NA1 to NA2n–1 have their respective gates connected to word lines WL1 to WL2n–1, respectively. As such, MOS transistors NA1 to NA2n–1 are each controlled via their respectively corresponding word lines WL1 to WL2n–1.

Thus p MOS transistors P1, P2 serve as load transistors and n MOS transistors N1, N2 serve as drive transistors, and n MOS transistors NA0 to NA2n–1 serve as access transistors to implement a CMOS, SRAM memory cell. Hereinafter p MOS transistors P1, P2 will also be referred to as load transistors P1, P2, and n MOS transistors N1, N2 as drive transistors N1, N2, and n MOS transistors NA0 to NA2n–1 as access transistors.

Furthermore in the present embodiment storage nodes S0, S1 each has connected thereto access transistors set in number to correspond to a total number of ports (=2n) divided by two (=n). This corresponds in a conventional multiport SRAM to half the number of access transistors connected to each storage node. If the number of ports is further increased by one, that of access transistors connected to either one of storage nodes S0, S1 will be larger by one than that of access transistors connected to the other storage node. That is, in the present embodiment, the difference between the number of access transistors connected to storage node S0 and that of access transistors connected to storage node S1 is set to a maximum of one to consider effect of unbalance of memory cell on stability.

The multiport SRAM memory cells further includes between storage node S1 and ground potential GND series-connected n MOS transistors NW0 and NV0 serving as one pair and in total n pairs of n MOS transistors (NW0, NV0) to (NW2(n–1), NV2(n–1)).

N MOS transistors NW0 to NW2(n–1) have their respective gates connected to word lines WL0 to WL2(n–1), respectively. As such, MOS transistors NW0 to NW2(n–1) are each controlled via their respectively corresponding word lines WL0 to WL2(n–1).

N MOS transistors NV0 to NV2(n–1) have their respective gates connected to sub bit lines C0 to C2(n–1), respectively. MOS transistors NV0 to NV2(n–1) are thus each controlled via sub bit line C0 to C2(n–1).

The multiport SRAM memory cells further includes between storage node S0 and ground potential GND series-connected n MOS transistors NW1 and NV1 serving as one pair and in total n pairs of n MOS transistors (NW1, NV1) to (NW2n–1, NV2n–1).

N MOS transistors NW1 to NW2n–1 have their respective gates connected to word lines WL1 to WL2n–1, respectively. As such, MOS transistors NW1 to NW2n–1 are each controlled via their respectively corresponding word lines WL1 to WL2n–1.

N MOS transistors NV1 to NV2n−1 have their respective gates connected to sub bit lines C1 to C2n−1, respectively. MOS transistors NV1 to NV2n−1 are thus each controlled via sub bit line C1 to C2n−1.

Note that the multiport SRAM has a general configuration, although not shown, basically identical to the FIG. 1 2-port SRAM, including a memory array having the FIG. 13 multiport SRAM memory cell arranged in a matrix, and row decode circuits XD0 to XD2n−1, column decode circuits YD0 to YD2n−1, column circuits YC0 to YC2n−1, control circuits WD0 to WD2n−1, and read and write control circuits SW0 to SW2n−1 and arranged for 2n ports, respectively.

Row decode circuits XD0 to XD2n−1, column decode circuits YD0 to YD2n−1, column circuits YC0 to YC2n−1, control circuits WD0 to WD2n−1 and read and write control circuits SW0 to SW2n−1 have their respective configurations basically identical to those described in the first embodiment with reference to FIGS. 3–8, except that they receive and output different signals.

As such, for an operation writing through port i, wherein i is an integer of no less than 0 and less than 2n, a row decode circuit XD (not shown) is timed by a clock signal Ti rising to decode an X address signal Xi and be driven by a result of the decoding to activate a word line WLi to selected state. Simultaneously, a column decode circuit YD (not shown) also decodes Y address signals Yi0, Yi1 . . . and in accordance with a result of the decoding outputs column select signals YSi0, YSi1 . . . to select a single memory cell.

With reference to FIG. 13, in a write, word line WLi is activated and in response a corresponding access transistor NAi is turned on. In response, an input data signal Di is driven to a bit line Bi and transmitted and written to a corresponding storage node of a latch circuit. An n MOS transistor NVi connected between the other storage node and ground potential GND is turned on/off in response to the potential of a sub bit line Ci and the storage node is driven to data of an inverted version of input data signal Di.

In a read through port i, a single memory cell is selected and in response to word line WLi being activated a corresponding access transistor NAi is turned on to transmit a storage node's potential to bit line Bi. N MOS transistor NVi connected between the other storage node and ground potential GND turns off in response to sub bit line Ci having the low level and the storage node does not vary in potential.

The multiport SRAM memory thus configured provides a current driving ability ratio (or β ratio) increased to approximately twice that of a conventional multiport SRAM as the former has a storage node having connected thereto an access transistor reduced in number to half. That is, the 2n port SRAM of the present embodiment ensures that it can hold data as steadily as a conventional n-port SRAM. This does not require β ratio increased as the number of ports is increased, and a sufficient write margin can be held.

Furthermore, the 2n ports can each be used to both reading and writing data, which can facilitate design.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having n ports each capable of accommodating reading and writing, n representing a natural number, comprising:

a memory cell array having a plurality of memory cells arranged in a row and a column;

n word lines associated with each row of said plurality of memory cells and selectively activated in accordance with a result of selection of a row in an operation performed to read and write through each of said n ports;

a plurality of first bit lines having n thereof associated with each column of said plurality of memory cells, and each having corresponding column's memory cells connected thereto; and a plurality of second bit lines having n thereof associated with each column of said plurality of memory cells, and each forming a bit line pair together with one of said plurality of first bit lines, said n word lines including
i first word lines selectively activated in accordance with a result of selection of a row in an operation performed to read and write through each of i ports, i being a natural number smaller than n, and
(n−i) second word lines selectively activated in accordance with a result of selection of a row in an operation performed to read and write through each of (n−i) ports, each of said plurality of memory cells including
a latch circuit having first and second storage nodes to hold first and second potentials complementarily,
i first access transistors each arranged between said first storage node and one of i of said plurality of first bit lines and selectively turned on responsively when a corresponding one of said i first word lines is activated,
(n−i) second access transistors each arranged between said second storage node and one of (n−i) of said plurality of first bit lines and selectively turned on responsively when a corresponding one of said (n−i) second word lines is activated,
(n−i) second write access transistors and (n−i) second storage level drive transistors each arranged between said first storage node and said first potential in series and turned on in response to said corresponding one of said (n−i) second word lines being activated and a potential of a corresponding one of said plurality of second bit lines, respectively, and
i first write access transistors and i first storage level drive transistors each arranged between said second storage node and said first potential in series, and selectively turned on in response to said corresponding one of said i first word lines being activated and a potential of a corresponding one of said plurality of second bit lines, respectively.

2. The semiconductor memory device of claim 1, wherein:

in an operation performed to write through a k-th port to a memory cell selected from said plurality of memory cells, k being a natural number of no more than n, a k-th one of said plurality of first bit lines is driven to one of said first and second potentials corresponding to input data and a k-th one of said plurality of second bit lines is driven to a potential equal to that of said k-th one of said plurality of first bit lines;

in said memory cell a k-th one of said first access transistors operates in response to a corresponding, k-th one of said first word lines being activated to turn on to transmit a potential of said k-th one of said plurality of first bit lines to said first storage node;

a k-th one of said first storage level drive transistors operates in response to a potential of said k-th one of said plurality of second bit lines to electrically couple/ decouple said first potential and a k-th one of said first write access transistors and drive to said k-th one of said first write access transistors a potential complementary to that of said k-th one of said plurality of first bit lines; and said k-th one of said first write access transistors operates in response to said k-th one of said first word lines corresponding thereto being activated to turn on to transmit to said second storage node a potential complementary to that of said k-th one of said plurality of first bit lines.

3. The semiconductor memory device of claim 2, further comprising:

a control circuit synchronized with a clock signal to generate a control signal allowing one of read and write operations to be performed; and a read and write circuit operative in response to said control signal to communicate data with said k-th one of said plurality of first bit lines having said memory cell connected thereto to read said input data from said memory cell and write said input data to said memory cell for storage, wherein when said control signal is activated to perform said write operation, said read and write circuit responsively drives said input data's potential to said k-th one of said plurality of first bit lines and said k-th one of said plurality of second bit lines.

4. The semiconductor memory device of claim 3, wherein:

when said control signal is activated to perform said read operation, said read and write circuit responsibly drives said first potential to said k-th one of said plurality of second bit lines;

in said memory cell, said k-th one of said first access transistors operates in response to said k-th one of said first word lines being activated to turn on to transmit said first storage node's potential to said k-th one of said plurality of first bit lines; and said k-th one of said first storage level drive transistors is inactivated in accordance with a potential of said k-th one of said plurality of second bit lines to hold said second storage node at a potential complementary to that of said first storage node.

5. The semiconductor memory device of claim 4, wherein each of said plurality of memory cells further includes a bit line load circuit supplying said k-th one of said plurality of first bit lines with a prescribed electric current while said read operation is performed.

6. The semiconductor memory device of claim 1, wherein i and (n−i) have therebetween a difference of a maximum of one.

7. A semiconductor memory device having n ports each accommodating reading and writing, n representing a natural number, comprising a memory cell array having a plurality of memory cells arranged in a row and a column;

n word lines associated with each row of said plurality of memory cells and selectively activated in accordance with a result of selection of a row in an operation performed to read and write through each of said n ports;

a plurality of first bit lines having n thereof associated with each column of said plurality of memory cells, and each having corresponding column's memory cells connected thereto;

a plurality of second bit lines having n thereof associated with each column of said plurality of memory cells, and each forming a bit line pair together with one of said plurality of first bit lines;

first and second common signal lines having n thereof in total associated with each column of said plurality of memory cells to correspond to each of said plurality of second bit lines;

i first storage level drive transistors, each arranged between one of i of said first common signal lines and a first potential, turned on in response to a potential of a corresponding one of said plurality of second bit lines, i being a natural number smaller than n; and (n−i) second storage level drive transistors, each arranged between one of (n−i) of said second common signal lines and said first potential, turned on in response to a potential of a corresponding one of said plurality of second bit lines, said n word lines including i first word lines selectively activated in accordance with a result of selection of a row in an operation performed to read and write through each of i ports, and (n−i) second word lines selectively activated in accordance with a result of selection of a row in an operation performed to read and write through each of (n−i) ports, each of said plurality of memory cells including a latch circuit having first and second storage nodes to hold said first potential and second potentials complementarily, i first access transistors each arranged between said first storage node and one of i of said plurality of first bit lines and selectively turned on responsively when a corresponding one of said i first word lines is activated, (n−i) second access transistors each arranged between said second storage node and one of (n−i) of said plurality of first bit lines and selectively turned on responsively when a corresponding one of said (n−i) second word lines is activated, (n−i) second write access transistors each arranged between said first storage node and one of (n−i) of said second common signal lines, and turned on responsively when said corresponding one of said (n−i) second word lines is activated, and i first write access transistors each arranged between said second storage node and one of i of said first common signal lines, and turned on responsively when said corresponding one of said i first word lines is activated.

8. The semiconductor memory device of claim 7, wherein said first and second storage level drive transistors are provided in a well contact region shared by said plurality of memory cells.

9. The semiconductor memory device of claim 7, wherein i and (n−i) have therebetween a difference of a maximum of one.

* * * * *